US006741078B2

United States Patent
Overweg

(10) Patent No.: US 6,741,078 B2
(45) Date of Patent: *May 25, 2004

(54) VERTICAL FIELD TYPE MRI APPARATUS WITH A CONICAL CAVITY SITUATED IN THE MAIN MAGNET

(75) Inventor: Johannes Adrianus Overweg, Uelzen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

This patent is subject to a terminal disclaimer.

(21) Appl. No.: 09/962,297

(22) Filed: Sep. 25, 2001

(65) Prior Publication Data

US 2002/0050820 A1 May 2, 2002

(30) Foreign Application Priority Data

Sep. 26, 2000 (EP) .............................................. 00203322

(51) Int. Cl.[7] ................................................. G01V 3/00
(52) U.S. Cl. ........................................................ 324/318
(58) Field of Search ................................ 324/307, 309, 324/318, 319, 320; 304/307, 309, 318, 322

(56) References Cited

U.S. PATENT DOCUMENTS

| | | | |
|---|---|---|---|
| 5,917,395 A | 6/1999 | Overweg | 335/296 |
| 5,939,962 A | 8/1999 | Tahara et al. | 335/216 |

FOREIGN PATENT DOCUMENTS

| | | | |
|---|---|---|---|
| EP | 0807940 A1 | 11/1997 | H01F/7/22 |
| WO | WO9921476 | 5/1999 | A61B/5/055 |

OTHER PUBLICATIONS

Morgan et al., "Open Access Conical Magnets for MRI," Apr. 7—May 3, 1996, p. 1399.

Patent Applications of Japan, Takeshima Hirotaka, "Gradient Magnetic Field Coil And Magnetic Resonance Imaging Apparatus Using The Same," Publication No. 09262223, Jul. 10, 1997, Application No. 08099670, Mar. 29, 1996.

Primary Examiner—Diego Gutierrez
Assistant Examiner—Dixomara Vargas
(74) Attorney, Agent, or Firm—John Vodopia

(57) ABSTRACT

The invention relates to a vertical field type MRI apparatus provided with a superconducting coil system 20a, 20b for generating a substantially homogeneous magnetic field in an imaging volume 18 of the apparatus. The coil system includes a circular outer coil 28 and a supplementary coil 30 which is positioned in the same plane 32 as and within the outer coil, which coils conduct opposite currents. The ratio $D_a/D_o$ of the diameter $D_a$ of the supplementary coil to the diameter $D_o$ of the outer coil lies between 0,7 and 0,9. Further coils 34 to 38, 40 to 46 for making the field even more homogeneous are preferably located on a conical surface 48, 50 within the first mentioned coils 28, 30 in such a manner that a recess is formed in which a conically shaped gradient coil system 52 can be accommodated, with the result that the expensive outer coil 28 and the supplementary coil 30 can be arranged at an as short as possible distance from the space for receiving the patient to be examined.

9 Claims, 6 Drawing Sheets

VERTICAL FIELD TYPE MRI APPARATUS WITH A CONICAL CAVITY SITUATED IN THE MAIN MAGNET

BACKGROUND OF INVENTION

The invention relates to a vertical field type MRI apparatus for forming magnetic resonance images, including:
at least one field generating superconducting coil system for producing a substantially homogeneous magnetic field in an imaging volume of the apparatus,
which coil system includes:
a round outer coil that is situated in an outer coil plane;
a round supplementary coil that is situated within the outer coil.

An apparatus of this kind is known from U.S. Pat. No. 5,939,962. The homogeneous magnetic field required for MR imaging in such a vertical field type apparatus is usually generated by two oppositely situated magnetic poles wherebetween the patient to be examined can be arranged. Generally speaking, said magnetic field then has a vertical direction. Apparatus of this kind offers the advantage that the patient keeps a comparatively broad view of the surroundings when arranged in such an apparatus, so that sensations of claustrophobia occur less frequently.

An iron circuit that is capable of transporting the complete flux through the system becomes very heavy in the case of magnet systems having a field strength beyond approximately 0.5 T. A sensible alternative in that case is to omit the iron circuit completely and to construct the magnet system as an actively shielded air coil system. In that case there are no poles in the sense of iron structures that bound the space of the magnet system that is accessible to the patient, but the surfaces of the magnet system that bound the patient space will also be referred to hereinafter as "poles" for the sake of simplicity. For field strengths beyond 0.5 T the coils must be constructed so as to be superconducting. They are kept at the operating temperature in a cryostat. The "poles" are then formed by the outer wall of the vacuum envelope of the cryostat.

The cited United States patent discloses a superconducting coil system which consists of a round outer coil (a so-called "side coil" that is denoted by the reference $12a$ therein), a round supplementary coil (referred to therein as the "fourth coil" which bears the reference $12d$), and a number of further coils (referred to as the "second and the third coils" bearing the references $12b$ and $12c$ therein). The homogeneous field in the imaging volume is generated mainly by the first two coils $12a$ and $12b$ and the other coils mentioned superpose a further homogenizing field thereon.

As is generally known, and also described in the cited U.S. patent, for this type of apparatus the aim is to arrange the field generating coil in the upper magnetic pole at an as small as possible distance from the field generating coil in the lower magnetic pole. This aim stems from the fact that the production costs of such a system increase by approximately a power of five of said pole distance, so that it is advantageous to keep this distance as small as possible. Because of this aim, the outer coils in the known apparatus are arranged practically directly against the boundary of the freely accessible space between the magnetic poles.

When the outer coils are mounted in that manner, the gradient coils in the known apparatus must extend to practically the diameter of the associated outer coils because of the necessary linearity of the gradient field in the imaging volume. Consequently, room for the supplementary coil (also having a voluminous and heavy construction so as to achieve the required homogeneous field) can be found only above the upper gradient coil and below the lower gradient coil. Consequently, the construction of this already bulky and heavy coil must be even larger; however, the outer coil must then also become larger. Moreover, in the case of actively shielded magnetic coils the shielding coils must then also become larger. The ultimate effect of the foregoing is that the costs of the apparatus are substantially increased again.

SUMMARY OF THE INVENTION

It is an object of the invention to provide an apparatus of the kind set forth in which the distance between the outer coils and between the supplementary coils is as small as possible. To achieve this, the apparatus in accordance with the invention is characterized in that
the energizing of the outer coil and of the supplementary coil is such that these coils generate magnetic fields of opposite direction,
the supplementary coil is also situated in the outer coil plane, and
the ratio $D_a/D_o$ of the diameter $D_a$ of the supplementary coil to the diameter $D_o$ of the outer coil is between 0.7 and 0.9.

Because the supplementary coil is now also situated in the outer coil plane, the distance between the supplementary coils is minimized while taking into account the required dimensions of the imaging volume. A computer simulation of this configuration has demonstrated that no concessions need be made as regards the requirements in respect of field strength and/or homogeneity of the main field when use is made of said combination of said energizing and said diameter ratio. It has also been found that an adequate degree of freedom exists as regards the configuration of the further coils, that is, in dependence on the exact shape, dimensions and energizing of the outer coil and the supplementary coil.

An advantageous embodiment of the apparatus in accordance with the invention is provided with three further round coils. It has been found that a suitable compromise can thus be achieved between production costs (condition: few and small further coils) and field strength and homogeneity (condition: many and large further coils).

In a further advantageous embodiment in accordance with the invention the three further coils are situated on a conical surface, the apex of the conical surface being directed away from the imaging volume. Apart from the fact that this configuration very well satisfies the requirements as regards field strength and homogeneity, this embodiment notably offers the advantage that there is created an inner space (that is, a space around the vertical axis of the imaging volume) which, because of its conical shape, is very well compatible with a gradient coil having a conical external appearance. This shape of a cavity in the magnetic pole, that is, in the cryo container of the magnetic coils, also has an additional advantage. In normal operating conditions the cooling medium present in a cryo container, that is, liquid helium, has a pressure of approximately 1 bar. In given circumstances, however, this pressure may increase to as much as 3 bar. The helium container is surrounded by a vacuum space which, therefore, lies between the ambient atmosphere and the helium container. In the case of a cavity with square corners, as in the present state of the art, extreme mechanical stresses could occur at said pressures; when a more or less conical cavity is used, such stresses will occur to a much lesser extent because of the gradual shaping of the walls of the container.

A preferred embodiment of the MRI apparatus in accordance with the invention is provided with a second field generating superconducting coil system for producing the substantially homogeneous magnetic field in the imaging volume of the apparatus, which second coil system includes:
a second round outer coil which is situated in a second outer coil plane and whose diameter is larger than that of the first outer coil,
a second round supplementary coil which is situated within the outer coil and in the outer coil plane,
the energizing of the second outer coil and of the second supplementary coil being such that these coils generate magnetic fields of opposite direction.

It is feasible to provide the coil system for generating the homogeneous field with only one pole surface; in such apparatus a given concession is made in respect of homogeneity and field strength, but it nevertheless remains possible to use the apparatus for given medical purposes. An apparatus of this kind is known, for example, from U.S. Pat. No. 5,917,395. When the apparatus is constructed so as to have two pole surfaces as is more usual, an attractive location of the imaging volume relative to the pole surfaces can be chosen. This offers an advantage in the following circumstances: a given size of the imaging volume is defined in dependence on the amount of space desired for the patient. This size defines the minimum distance between the pole surfaces. It should be possible to make optimum use of this distance for all imaging purposes, notably the imaging of parts of the body that are situated at a low level in the imaging volume, for example the vertebral column which is situated directly above the table top in the case of patients in the supine position. This table top, of course, should be constructed so as to be as thin as possible as otherwise space that could be used for imaging is lost or the pole surfaces have to be arranged further apart again. The vertebral column is then situated at the edge of the imaging volume, so that optimum homogeneity is not possible over a great length. As a result of said steps (notably because the lower outer coil has a diameter which is larger than that of the upper coil), the imaging volume can be lowered relative to the pole surfaces, so that the vertebral column fits better in the imaging volume without it being necessary to enlarge the latter (which is expensive and leads to a high power consumption during operation).

A further embodiment of the apparatus in accordance with the invention is provided with four further round coils, each of which is situated in a respective further coil plane, the outer coil plane being situated between the imaging volume and each of the further coil planes. It has been found that said number of further coils enables a suitable compromise to be achieved between production costs, field strength and homogeneity in the case of the desired lowering of the imaging volume.

In another embodiment yet of the invention the four further round coils in the apparatus are situated on a conical surface, the apex of the conical surface being directed away from the imaging volume. Thus, there is created a space for the main field within the coil container, the conical shape of said space being very compatible with a gradient coil having a conical external appearance.

Another embodiment of the apparatus in accordance with the invention is provided with at least a first gradient coil system and a second gradient coil system for producing a magnetic gradient field in the imaging volume of the apparatus, each gradient coil system including a flat main gradient coil and a shielding coil, and the first gradient coil system being situated in a space within the first field generating superconducting coil system and the second gradient coil system being situated in a space within the second field generating superconducting coil system. The gradient coils are thus suitably arranged in the space created by the invention in the container of the field coils for the homogeneous field.

At least one of the shielding coils in a further embodiment of the invention extends across a substantially conical surface whose apex is directed away from the imaging volume. It has been found that a gradient coil is thus formed which produces a gradient field of the appearance required for MRI, notably in respect of linearity. The external shape thus obtained is particularly suitable for accommodating the gradient coil in the cavity formed in the coil container in accordance with the invention.

Another embodiment of the apparatus in accordance with the invention is provided with a first and a second container for the first and the second field generating superconducting coil system, respectively, said containers being arranged to contain a cryogenic medium and communicating with one another in order to exchange the cryogenic medium, one of the containers being provided with a pressure connection for controlling the pressure in the containers as desired. In the case of a system of superconducting coils it may occur that a part of the coils does not to come into direct contact with the cooling medium (liquid helium), because a part thereof has evaporated and hence the coils situated at the highest level have lost said contact. Consequently, said coils may come out of the superconducting state; this is undesirable notably during operation. The entire system of coils, so the contents of both coil containers, can now be cooled by means of one helium system by making the lower container in this system serve also as a reservoir by storing more liquid helium therein than necessary for the lower coil holder alone. Should one of the coils in the upper coil container tend to loose contact with the liquid medium, the pressure in the lower container can be increased so that liquid is forced from the reservoir space to the upper container. The contact with the liquid is ensured without it being necessary to use separate level control for the relevant container.

DESCRIPTION OF THE DRAWING FIGURES

The invention will be described in detail hereinafter with reference to the Figures in which corresponding reference numerals denote corresponding elements. Therein:

DETAILED DESCRIPTION OF THE INVENTION

Figure 1:
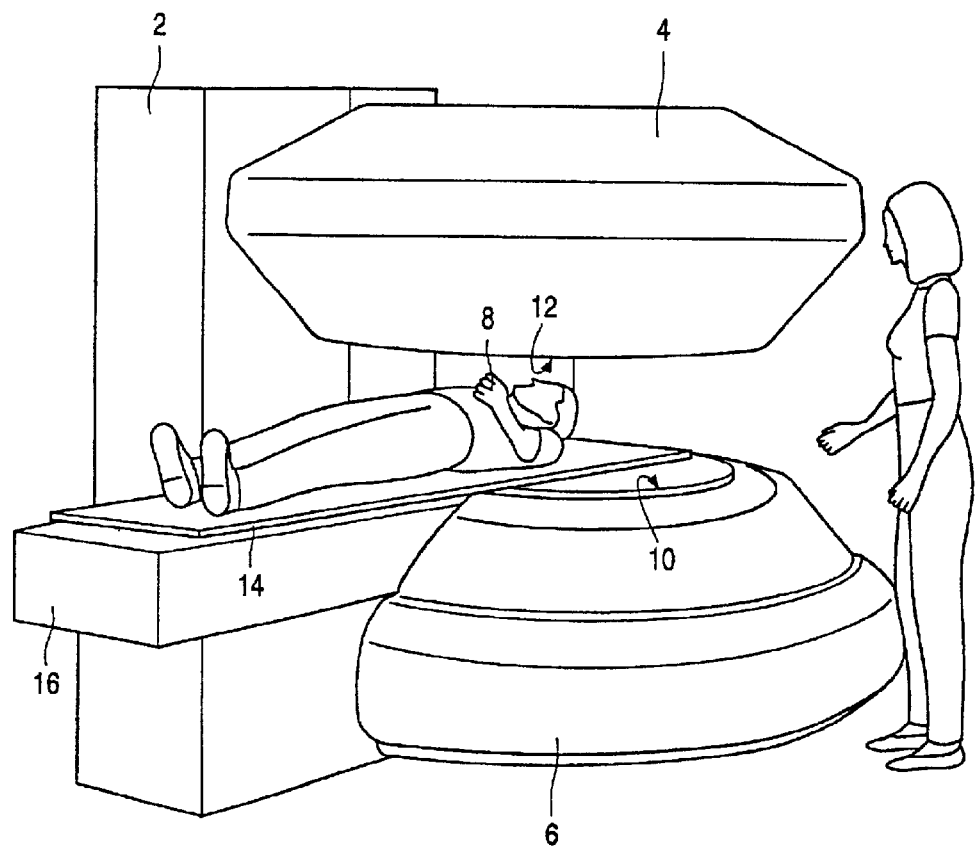
FIG. 1 is a general view of a known apparatus of the vertical field type for the formation of MRI images.

FIG. 1 is a general view of a known the vertical field type apparatus for the formation of MR images. The apparatus consists of a stand 2 which supports the lower magnetic pole 4 and the upper magnetic pole 4. It is to be noted that in the present context a magnetic pole is to be understood to mean the assembly of associated field generating coils, without it being necessary (but possible) to provide an iron circuit which interconnects the two magnetic poles so as to conduct the magnetic flux. A space for receiving a patient 8 to be examined exists between the magnetic poles. The patient to be examined is arranged on a table top 14 which itself is supported by a support 16 which forms part of the stand 2 so that the patient 8 can be arranged in the correct position and with the correct orientation between the magnetic poles 4 and 6.

The space for accommodating the patient to be examined in customary MRI apparatus is shaped as a tunnel having a cross-section of the order of magnitude of 60 cm; for many patients, notably children, this configuration provokes feelings of anxiety and sensations of claustrophobia. The advantage of the constellation of magnetic poles as shown in FIG. 1 resides in the fact that the patient retains a comparatively broad view of the surroundings when arranged in such an apparatus, so that such feelings and sensations are alleviated or even disappear.

At the side of the patient the magnetic poles are bounded by pole surfaces 10 and 12 which are physically formed as particular surface portions of upper and lower covers or outer vacuum containers 24a, 24b, respectively, of helium or cryo containers 22a, 22b respectively, in which superconducting magnetic coil systems 20a, 20b, corresponding to the upper and lower poles, respectively, are accommodated. The distance between the pole surfaces is chosen to be such that said uncomfortable sensations are counteracted for the patient, but not so large that the production of the magnetic poles becomes much more expensive. It has been found in practice that a distance of from 50 to 60 cm is a suitable value.

Figure 2:
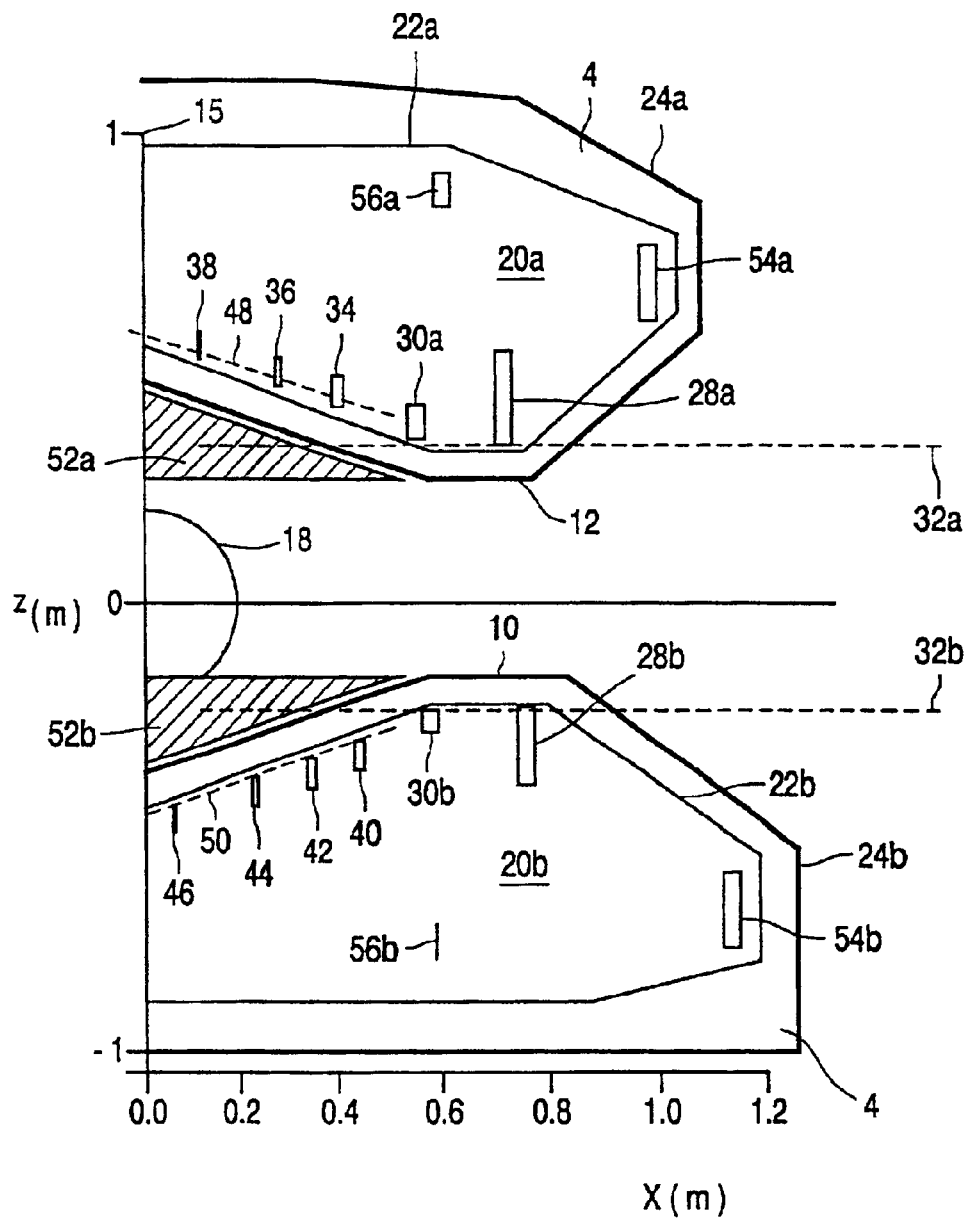
FIG. 2 is a sectional view through the poles, the coil systems in accordance with the invention being accommodated in the cryo containers.

FIG. 2 is a sectional view through the magnetic poles 4 and 6, highlighting the coil systems 20a and 20b in accordance with the invention. The coil systems are each arranged in the cryo containers, 20a, 20b, each of which is further arranged in outer cover or vacuum containers 22a, 22b, respectively. The Figure shows the section of the round coil systems (that is, circular symmetrical systems around a vertical line 15) with the plane of drawing; because of the circular symmetry, this Figure shows only half of the coil systems, but the other half may be assumed to be formed by mirror imaging relative to a plane extending through the line 15 and perpendicularly to the plane of drawing. Between the magnetic poles 4 and 6 there is situated a region 18 in which the field generated by said magnetic poles is sufficiently homogeneous so as to form MRI images. This region is referred to as the imaging volume of the apparatus. Each of the magnetic poles 4 and 6 includes field generating superconducting coil systems 20a, 20b, respectively, for producing a substantially homogeneous magnetic field in the imaging volume 18 of the apparatus (The coil system 20a is situated in the upper magnetic pole 4 and the coil system 20b is situated in the lower magnetic pole 6.) As is customary in the case of superconducting coils, the coil systems are accommodated in the upper and lower helium containers, 20a 20b, respectively, which as mentioned, are themselves enclosed by the covers or outer vacuum containers 24a, 24b, respectively.

Each of the coil systems includes round outer coils 28a, 28b, respectively, and round supplementary coils 30a, 30b, which is supplemental coils are situated therewithin, respectively. Both outer and supplementary coils are situated in one flat plane, that is, upper and lower outer coil planes 32a, 32b, The ratio $D_a/D_o$ of the diameter $D_a$ of the supplementary coil to the diameter $D_o$ of the outer coil generally lies between 0.7 and 0.9 and equals 0.8 in the present embodiment. In conformity with the idea of the invention, the distance between the two outer coils 28a and 28b as well as that between the two supplementary coils 30a and 30b can be minimized in this configuration, meaning that the distance between these coils (ignoring the space for the vacuum space, the covers and the radiation shields that are not shown) is substantially equal to the distance between the pole surfaces 10 and 12. The comparatively high costs of said coils can thus be limited to a minimum.

The upper coil system 20a also includes three further round coils 34, 36 and 38, each of which are situated in a respective further coil plane (not shown). Each of said further coil planes is situated further from the imaging volume 18 than the outer coil plane 32a. In the embodiment shown the further coils 32 to 38 are situated on a conical surface 48 whose section with the plane of drawing is shown, the apex of the conical surface 48 being directed away from the imaging volume, so upwards in the present case.

The lower coil system 20b also includes four further round coils 40, 42, 44 and 46, each of which is situated in a respective further coil plane (not shown). Each of said further coil planes is situated further from the imaging volume 18 than the outer coil plane 32b. In the embodiment shown the further coils 40 to 46 are situated on a conical surface 50 whose section with the plane of drawing is shown, the apex of the conical surface 50 being directed away from the imaging volume, so downwards in the present case.

It holds for both coil systems 20a and 20b that the energizing of the outer coils 28a and 28b is such that these coils produce a magnetic field of the same direction. The energizing of the supplementary coil 30a opposes that of the outer coil 28a whereas the energizing of the supplementary coil 30b opposes that of the outer coil 28b. The exact arrangement and energizing of the further coils 34 to 46 is aimed at further enhancement of the homogeneity of the magnetic field in the imaging volume 18; the arrangement of these coils has to be such that it enables the formation of a conical cavity in each of the magnetic poles. A gradient coil 52a, 52b can be arranged in each of said cavities, said gradient coils having a flat boundary at the side of the imaging volume and a conical boundary at the side that is remote from the imaging volume.

FIG. 2 shows that the imaging volume 18 is not situated exactly halfway between the pole surfaces 10 and 12 but has been lowered slightly relative to said center. As has already been described, this location of the imaging volume offers given advantages in respect of imaging of, for example the vertebral column. The downward shift of the imaging volume is achieved in that the outer field coil 28b of the lower coil system 20b has a diameter which is larger than that of the outer field coil 28a of the upper coil system 20a; a similar relationship exists between the supplementary coils 30a and 30b. As a result of these steps, the imaging volume can be lowered relative to the pole surfaces, so that the vertebral column of a patient in the supine position in the imaging volume fits better into the imaging volume, so that this volume need not be enlarged.

Each of the coil systems also includes a round outer shielding coil 54a, 54b and a round inner shielding coil 56a and 56b, respectively, which is situated within said outer shielding coils. These coils act in known manner to shield the environment from the magnetic field generated by the magnet coils.

Figure 3:
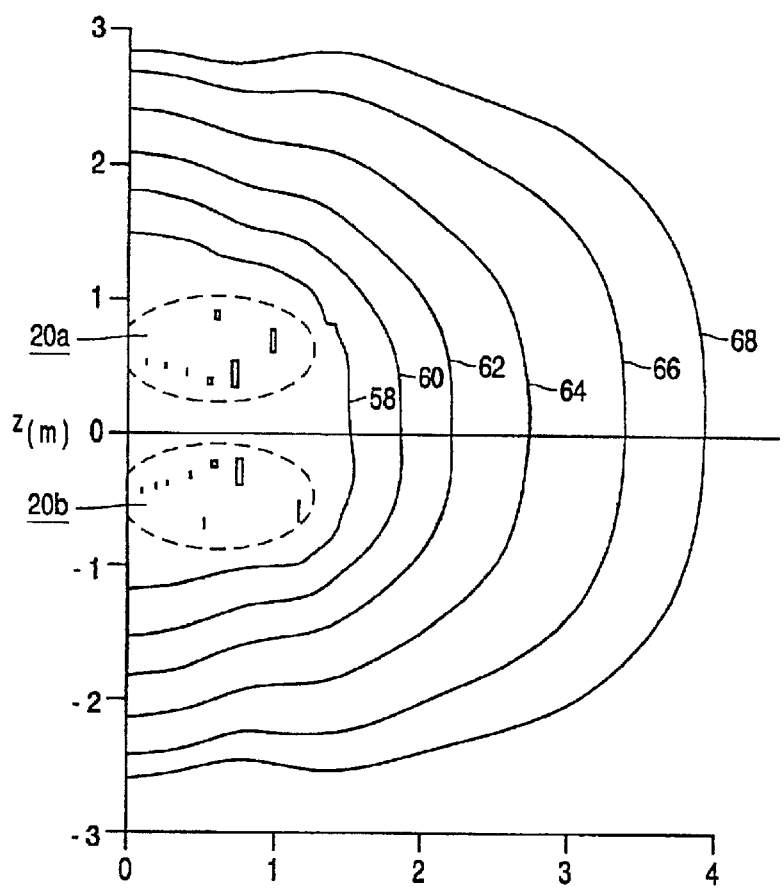
FIG. 3 is a graphic representation of the field variation around the imaging volume of the apparatus in accordance with the invention.

FIG. 3 is a graphic representation of the field geometry around the imaging volume of the apparatus in accordance with the invention. The horizontal distance to the center of the imaging volume 18 is plotted on the horizontal axis (the x axis) and the vertical distance to the center of the imaging volume 18 is plotted on the vertical axis (the z axis). The Figure shows the coil systems 20a and 20b diagrammatically and to scale. The lines 58, 60, 62, 64, 66 and 68 in this Figure constitute the lines of equal field strength. The field strengths of 10 mT, 3 mT, 1 mT, 0.3 mT, 0.1 mT and 0.05 mT, respectively, are associated with said lines. Thus, it appears from this Figure that the field decays very rapidly directly outside the imaging volume and that an increase of the distance from 1.5 m (line 58) to 3.5 m (line 66) causes a field decrease by even a factor of 100.

FIG. 4 shows the construction of a gradient coil system in the form of a shielded gradient coil that is suitable for use in the apparatus in accordance with the invention. The gradient coil system consists of a main gradient coil for actually generating the gradient field and a shielding coil for compensating the gradient field as much as possible outside the imaging volume (notably at the area of the metal parts of the main magnet). The main gradient coil is wound in a flat plane whereas the shielding coil extends across a substantially conical surface whose apex is directed away from the imaging volume. This external appearance of a gradient coil can be used for the x gradient coil as well as for the y gradient coil and the z gradient coil. However, the shape of the conductors of the x coil and the y coil deviates from that of the conductors of the z coil. The overall shape of the gradient coil system thus formed is shown in the side elevation of FIG. 4a which is rotationally symmetrical around the line 70. The main gradient coil therein is denoted by the reference numeral 72 and the shielding coil is denoted by the reference numeral 74. A cylindrical return conductor (yet to be described) is denoted by the reference numeral 76.

Figure 4A:
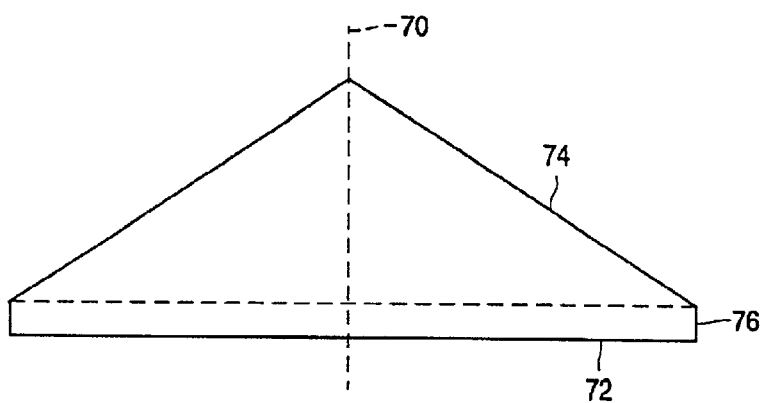
FIG. 4a is a general view of the external appearance of a gradient coil system in accordance with the invention.
Figure 4B:
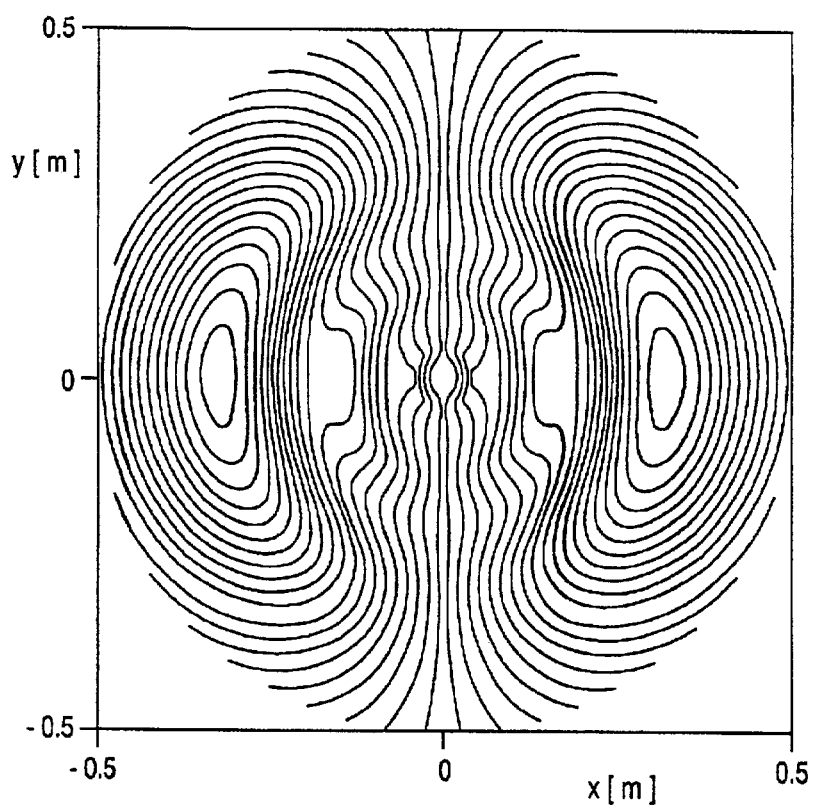
FIG. 4b shows the conductor pattern of the flat x main gradient coil of the gradient coil system in accordance with the invention.
Figure 4C:
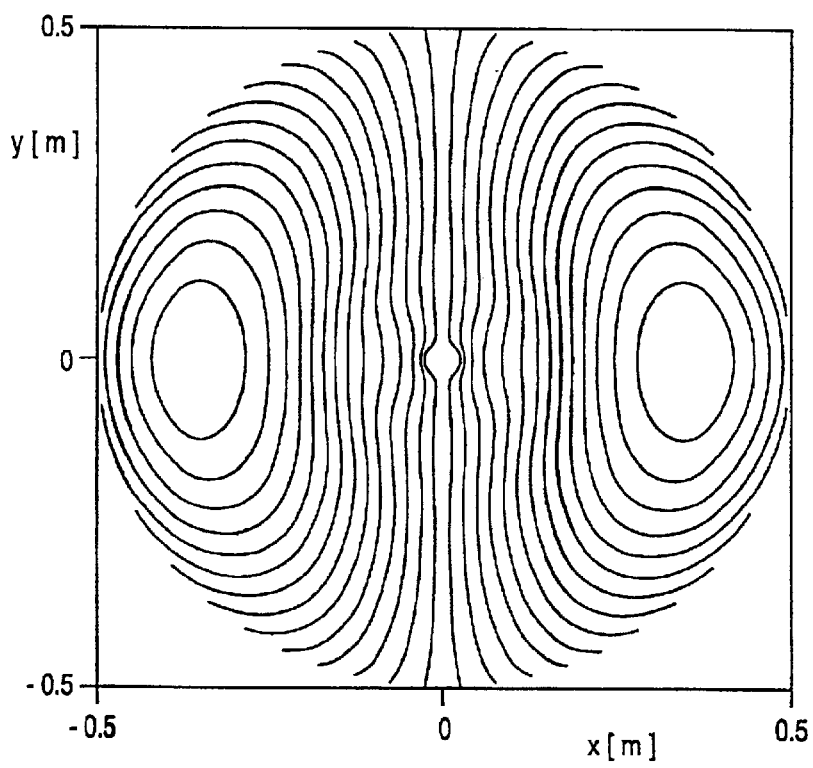
FIG. 4c shows the conductor pattern of the x shielding coil of the gradient coil system in accordance with the invention.

FIG. 4b shows the conductor pattern of the x and the y main gradient coil 72; the x and the y coils have the same appearance, but are mounted so as to be 90° offset relative to one another. These conductors generally have the shape of a number of concentric letters D which, moreover, are mirror imaged relative to one another. The concentric Ds are connected in series (not shown). The conductor patterns of the shielding coils 74 for the x gradient and the y gradient as shown in FIG. 4c have substantially the same appearance as those of the main gradient coil. However, these conductors are not arranged in a flat plane but on a conical surface whose apex height amounts to approximately twice the height of a corresponding gradient coil system having a flat shielding coil extending parallel to the main gradient coil.

Figure 4D:
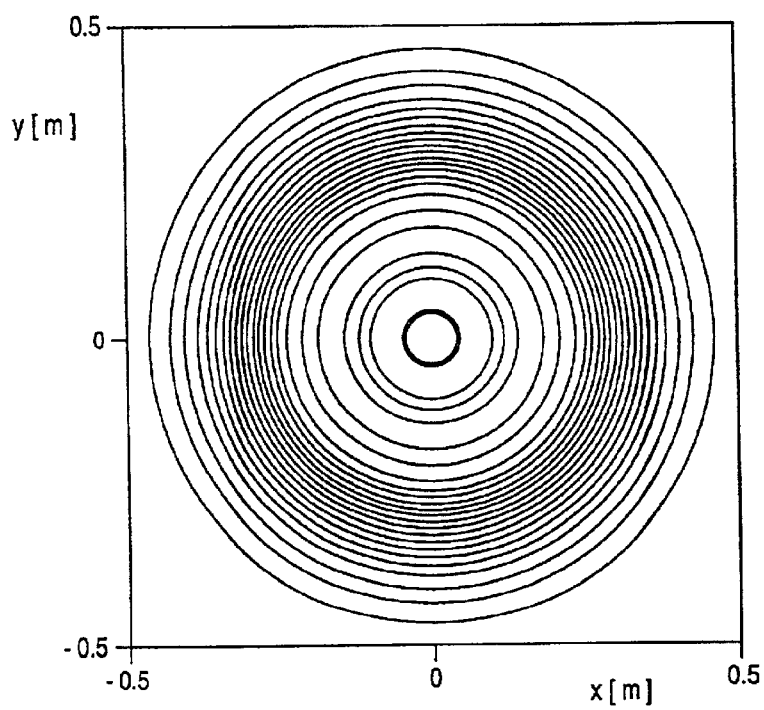
FIG. 4d shows the conductor pattern of the flat z main gradient coil of the gradient coil system in accordance with the invention.
Figure 4E:
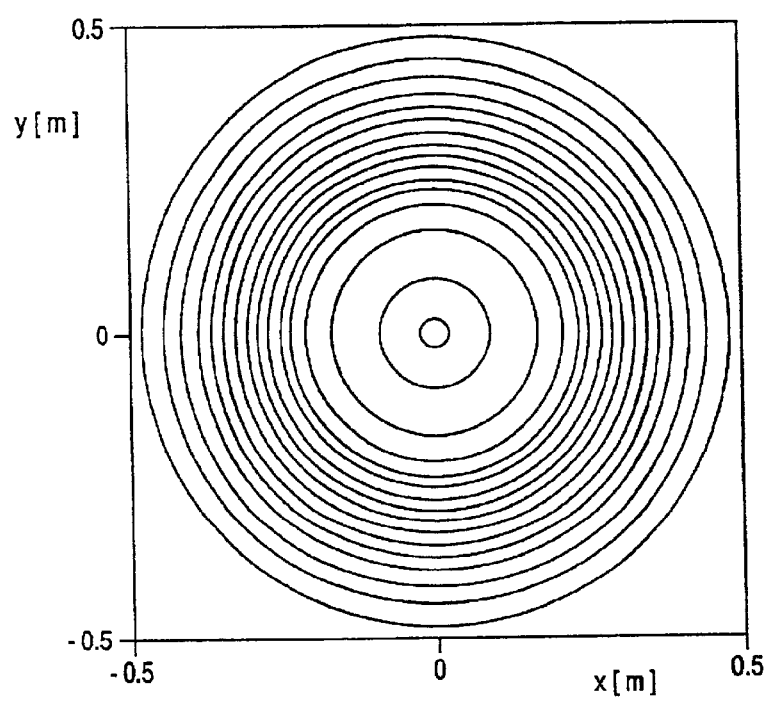
FIG. 4e shows the conductor pattern of the z shielding coil of the gradient coil system in accordance with the invention.

FIG. 4d shows the conductor pattern of the z main gradient coil 72. Generally speaking, these conductors have the shape of a number of concentric, non-equidistant circles. The concentric circles are connected in series (not shown). The conductor pattern of the shielding coil 74 for the z gradient (FIG. 4e) has substantially the same appearance as that of the main gradient coil 72. However, these conductors are not arranged in a flat plane but on a conical surface whose apex height amounts to approximately twice the height of a corresponding gradient coil system having a flat shielding coil extending parallel to the main gradient coil.

The function of the return conductors of the main coil and those of the shielding coil can be combined in a manner that is known per se for the x gradient coil, the y gradient coil as well as the z gradient coil, with the result that return conductors can be dispensed with to a substantial degree. The currents then flow from the main coil to the shielding coil via a cylindrical connection 76 on the side of the gradient coil system.

Figure 4F:
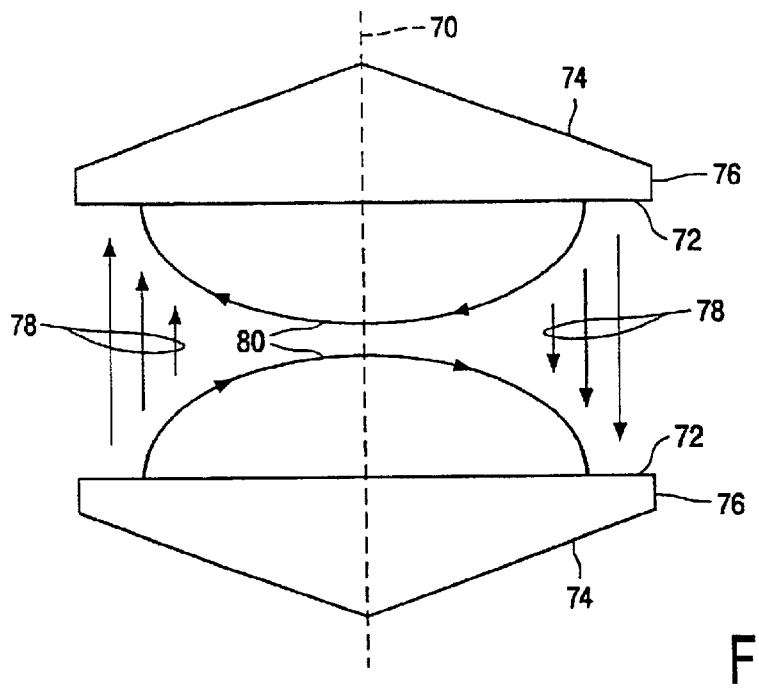
FIG. 4f is a side elevation of an x gradient coil system in accordance with the invention, together with and the gradient field generated by this system.

FIG. 4f is a side elevation of an x gradient coil; it also shows the distribution of the gradient field of said coil. (The same applies to the y gradient coil.) The straight arrows 78 therein represent the field strength of the gradient field, that is, $\partial B_z/\partial x$, and the curved lines 80 represent the field lines of the gradient field. This Figure clearly shows the gradient variation of the field, that is, the variation of the field that is superposed on the magnetic main field and varies linearly as a function of the location in the x direction.

Figure 5:
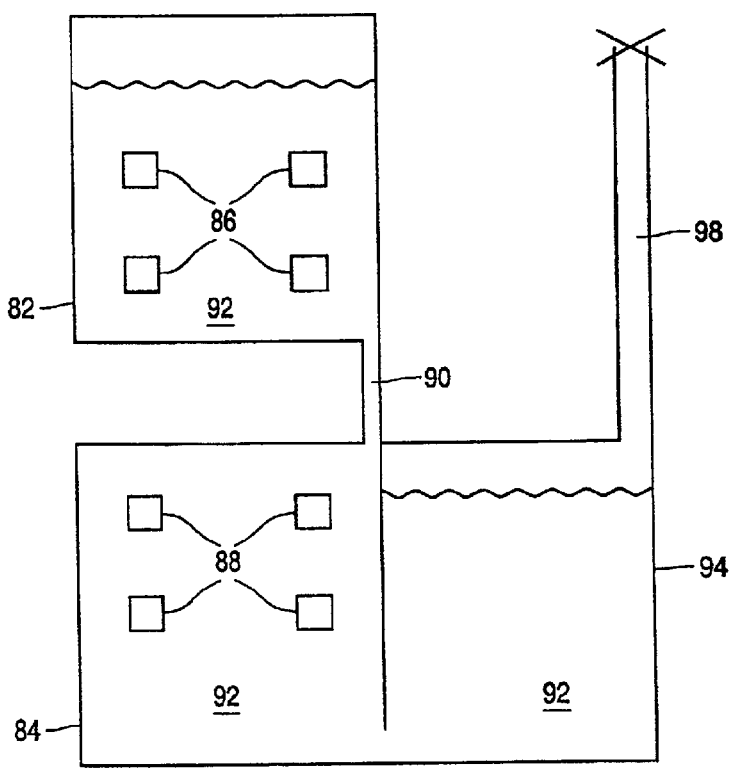
FIG. 5 shows diagrammatically a cryo system that is suitable for use in the apparatus in accordance with the invention.

FIG. 5 shows diagrammatically a cryo system that is suitable for use in the apparatus in accordance with the invention. The system includes a first, upper cryo container 82 and a second, lower cryo container 84 which accommodate with field generating superconducting coil systems 86 and 88. Each of the two cryo containers contains a cryogenic medium 92 in the form of liquid helium. The two cryo containers 82 and 84 communicate via a connection duct 90 for the exchange of the liquid helium. The cryo container 84 is subdivided into two compartments 94 and 96, the compartment 94 containing the coil system 88 whereas the compartment 96 acts as a helium reservoir. The compartment 94 is provided with a pressure connection 98 for controlling the pressure in the containers as desired. When the coils in the upper coil container tend to loose contact with the liquid helium, the pressure on the lower container can be increased via the pressure connection 98, so that liquid helium is forced from the reservoir space 92 to the upper container 82 via the compartment 96. The contact with the liquid helium is thus ensured despite the absence of separate level control for the upper container.

What is claimed is:

1. A vertical field type MRI apparatus for forming magnetic resonance images, including:
    at least one field generating superconducting coil system for producing a substantially homogeneous magnetic field in an imaging volume of the apparatus, which coil system includes:
        a round outer coil arranged in an outer coil plane; and
        a round supplementary coil arranged within the outer coil, wherein the energizing of the outer coil and of the supplementary coil generates magnetic fields of opposite direction, wherein the supplementary coil is located in the outer coil plane, and wherein the ratio $D_a/D_o$ of the diameter $D_a$ of the supplementary coil to the diameter $D_o$ of the outer coil is between 0.7 and 0.9.

2. An apparatus as claimed in claim 1 and provided with three further round coils, each of which is arranged in a respective further coil plane, the outer coil plane arranged between the imaging volume and each of the further coil planes.

3. An apparatus as claimed in claim 2, wherein the three further round coils are arranged on a conical surface, the apex of the conical surface being directed away from the imaging volume.

4. An apparatus as claimed in claim 1 and provided with a second field generating superconducting coil system for producing the substantially homogeneous magnetic field in the imaging volume of the apparatus, which second coil system includes:
   a second round outer coil arranged in a second outer coil plane and having a diameter that is larger than the diameter of the first outer coil,
   a second round supplementary coil arranged within the second outer coil and in the second outer coil plane, wherein the energizing of the second outer coil and of the second supplementary coil generates magnetic fields of opposite direction.

5. An apparatus as claimed in claim 4 and provided with four further round coils, each of which is arranged in a respective further coil plane, the outer coil plane located between the imaging volume and each of the further coil planes.

6. An apparatus as claimed in claim 5, wherein the four further round coils are arranged on a conical surface, the apex of the conical surface being directed away from the imaging volume.

7. A vertical field type MRI apparatus for forming magnetic resonance images, including:
   a first field generating superconducting coil system for producing a substantially homogeneous magnetic field in an imaging volume of the apparatus which coil systems includes:
   a round outer coil arranged in an outer coil plane; and
   a round supplementary coil arranged within the outer coil wherein the energizing of the outer coil and of the supplementary coil generates magnetic fields of opposite direction, wherein the supplementary coil is located in the outer coil plane, and wherein the ratio $D_a/D_o$ of the diameter $D_a$ of the supplementary coil to the diameter $D_o$ of the outer coil is between 0.7 and 0.9; and
   a second field generating supperconducting coil system for producing the substantially homogeneous magnetic field in the imaging volume of the apparatus, which second coil system includes;
   a second round outer coil arranged in a second outer coil plane and having a diameter that is larger than the diameter of the first outer coil,
   a second round supplementary coil arranged within the second outer coil and in the second outer coil plane, wherein the energizing of the second outer coil and of the second supplementary coil generates magnetic fields of opposite direction;
   wherein said vertical field type MRI apparatus further includes at least a first gradient coil system and a second gradient coil system for producing a magnetic gradient field in the imaging volume of the apparatus, wherein each gradient coil system includes a flat main gradient coil and a shielding coil, and wherein the first gradient coil system is arranged in a space within said first field generating superconducting coil system and the second gradient coil system is arranged in a space within the second field generating superconducting coil system.

8. An apparatus as claimed in claim 7, wherein at least one of the shielding coils extends across a substantially conical surface whose apex is directed my from the imaging volume.

9. A vertical field type MRI apparatus for forming magnetic resonance images, including;
   a first field generating supperconducting coil system for producing a substantially homogeneous magnetic field in an imagine volume of the apparatus, which coil sytem includes:
   a round outer coil arranged in an outer coil plane; and
   a round supplementary coil arranged within the outer coil, wherein the energizing of the outer coil and of the supplementary coil generates magnetic fields of opposite direction, wherein the supplementary coil is located in the outer coil plane, and wherein the ratio $D_o/D_a$ of the diameter $D_o$ of the supplementary coil to the diameter $D_o$ of the outer coil is between 0.7 and 0.9; and
   a second field generating supperconducting coil system for producing the substantially homogeneous magnetic field in the imaging volume of the apparatus, which second coil system includes;
   a second round outer coil arranged in a second outer coil plane and having a diameter that is larger than the diameter of the first outer coil,
   a second round supplementary coil arranged within the second outer coil and in the second outer coil plane wherein the energizing of the second outer coil and of the second supplementary coil generates magnetic fields of opposite direction;
   wherein said vertical field type MRJ apparatus further includes a first and a second container for the first and the second field generating superconducting coil system, respectively, said containers being arranged to contain a cryogenic medium and communicating with one another in order to exchange the cryogenic medium, one of the containers being provided with a pressure connection for controlling the pressure in the containers as desired.

* * * * *